United States Patent
Liu et al.

(10) Patent No.: US 8,487,293 B2
(45) Date of Patent: Jul. 16, 2013

(54) BIPOLAR SWITCHING MEMORY CELL WITH BUILT-IN "ON" STATE RECTIFYING CURRENT-VOLTAGE CHARACTERISTICS

(75) Inventors: Jun Liu, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 168 days.

(21) Appl. No.: 12/981,947

(22) Filed: Dec. 30, 2010

(65) Prior Publication Data

US 2012/0168705 A1 Jul. 5, 2012

(51) Int. Cl.
*H01L 45/00* (2006.01)
*H01L 21/02* (2006.01)

(52) U.S. Cl.
USPC . 257/4; 438/382; 257/2; 257/5; 257/E45.001; 257/E21.004

(58) Field of Classification Search
USPC ........ 257/2, 4, 5, E45.001, E21.004; 438/382
See application file for complete search history.

(56) References Cited

U.S. PATENT DOCUMENTS

| | | | |
|---|---|---|---|
| 7,214,587 B2 | 5/2007 | Pinnow et al. | |
| 7,479,650 B2 * | 1/2009 | Gilton | 257/4 |
| 7,750,332 B2 * | 7/2010 | Sakamoto et al. | 257/2 |
| 2008/0304307 A1 | 12/2008 | Gopalakrishnan | |
| 2009/0273964 A1 | 11/2009 | Yamazaki et al. | |
| 2010/0046275 A1 | 2/2010 | Hosono et al. | |
| 2011/0193051 A1 * | 8/2011 | Nam et al. | 257/4 |

* cited by examiner

*Primary Examiner* — Calvin Lee
*Assistant Examiner* — Monica D Harrison
(74) *Attorney, Agent, or Firm* — Fletcher Yoder (57) ABSTRACT

A memory array is disclosed having bipolar current-voltage (IV) resistive random access memory cells with built-in "on" state rectifying IV characteristics. In one embodiment, a bipolar switching resistive random access memory cell may have a metal/solid electrolyte/semiconductor stack that forms a Schottky diode when switched to the "on" state. In another embodiment, a bipolar switching resistive random access memory cell may have a metal/solid electrolyte/tunnel barrier/electrode stack that forms a metal-insulator-metal device when switched to the "on" state. Methods of operating the memory array are also disclosed.

25 Claims, 4 Drawing Sheets

BIPOLAR SWITCHING MEMORY CELL WITH BUILT-IN "ON" STATE RECTIFYING CURRENT-VOLTAGE CHARACTERISTICS

BACKGROUND

1. Field of Invention

One or more embodiments of the invention relate generally to the field of non-volatile memory devices and more particularly, to resistive random access memory devices.

2. Description of Related Art

Computer systems are generally employed in numerous configurations to provide a variety of computing functions. Processing speeds, system flexibility, and size constraints are typically considered by design engineers tasked with developing computer systems and system components. Computer systems generally include a plurality of memory devices which may be used to store programs and data and which may be accessible to other system components such as processors or peripheral devices. Such memory devices may include volatile and non-volatile memory devices.

Non-volatile memory devices may include read-only memory (ROM), magnetic storage, flash memory, etc. One type of non-volatile memory is resistive random access memory (RRAM). Various types of RRAM may be used, such as unipolar switching RRAM and bipolar switching RRAM. However, each type of RRAM may have different applications and some types of RRAM may be unusable in certain memory architectures.

DETAILED DESCRIPTION

As discussed in further detail below, embodiments of the present invention include a bipolar switching resistive random access memory (RRAM) cell having built-in "on" state rectifying current-voltage (IV) characteristics such that the memory cell may be used without an external selection device. As used herein, the term "built-in" refers to characteristics (or devices) internal to the bipolar switching resistive random access memory (RRAM) cell, as opposed to characteristics provided by a device external to the memory cell. The bipolar switching RRAM cell may be used in smaller memory architectures, such as 4F2 cross-point architectures. In one embodiment, the bipolar switching RRAM cell may include a metal/solid electrolyte/semiconductor stack. In other embodiments, the bipolar switching RRAM cell may include a metal/solid electrolyte/insulator/electrode stack. In either embodiment, a metal filament may be formed in the solid electrolyte to form a device having rectifying IV characteristics.

Figure 1:
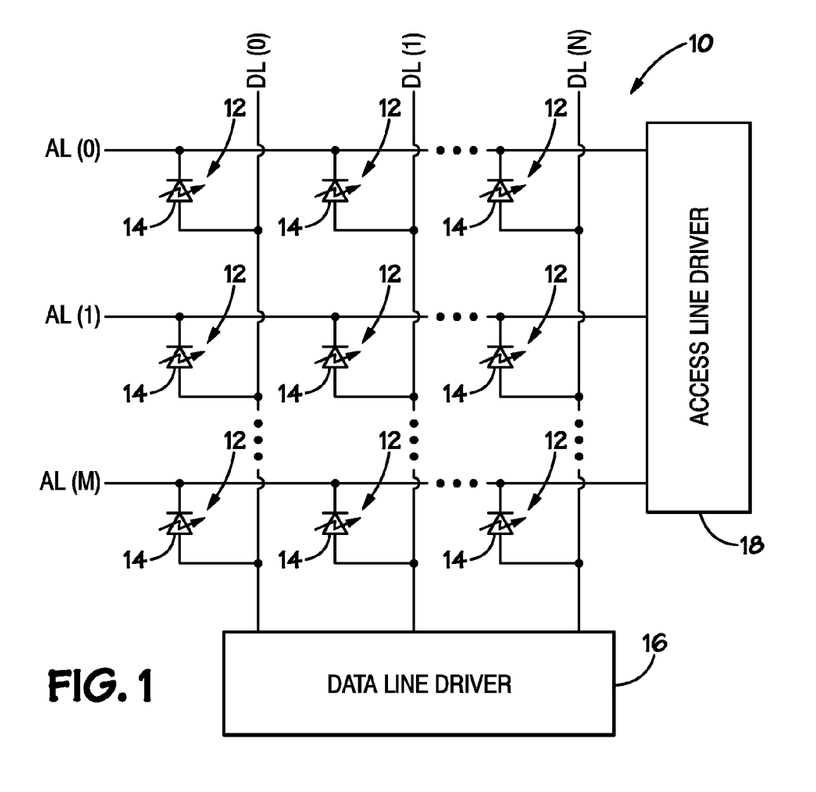
FIG. 1 is a schematic diagram of a memory array in accordance with an embodiment of the present invention.

FIG. 1 is a two-dimensional schematic diagram of a portion of a memory array 10 having memory cells 12 constructed in accordance with embodiments of the present invention. The memory array 10 includes access lines (e.g., wordlines) AL(0)-AL(M) and intersecting data lines (e.g., bitlines) DL(0)-DL(N).

The memory array 10 includes a memory cell 12 located at each intersection of an access line AL and a data line DL. The memory cells 12 may include resistive memory elements 14 that may be formed in accordance with the embodiments discussed below in FIGS. 2A and 2B and 5A and 5B. Each memory element 14 may be coupled to a data line, and the data lines are connected to a data line drive 16 (e.g., one or more data line drivers/sense amplifiers). A row of the memory cells 12 include those memory elements 14 whose terminals are commonly coupled (e.g., to a given access line AL). The access lines may be coupled to an access line driver 18. Thus, to activate a row of memory cells 12, one or more of the access lines may be activated via the access line driver 18, and the corresponding data lines may be read.

In certain embodiments, the memory array 10 may be constructed using a 4F2 cross-point architecture, such that each data line and adjacent space occupies a width of 2F and each access line and adjacent space occupies a width of 2F, wherein F is the lithographic-resolution limit (e.g., the photolithographic-resolution limit or minimum feature size achievable). In other embodiments, the memory array 10 may be constructed using an 8F2, 6F2, or other architecture. In such a 4F2 cross-point architecture, the digit line and the access line may be formed perpendicular to each other in a "cross-point" arrangement. However, a conventional 4F2 resistive random access memory array requires a diode selection device to prevent cross-talk between adjacent memory cells and rows of memory cells, thus limiting the application of 4F2 architectures to unipolar memory cells having such diode selection devices.

Figure 2A:
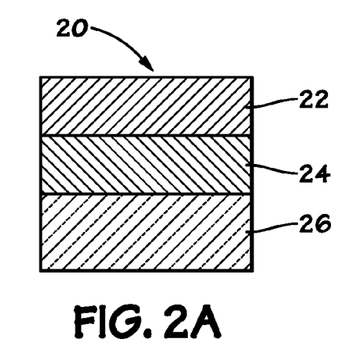
FIGS. 2A and 2B are cross-sectional views of a resistive random access memory cell in accordance with an embodiment of the present invention.
Figure 2B:
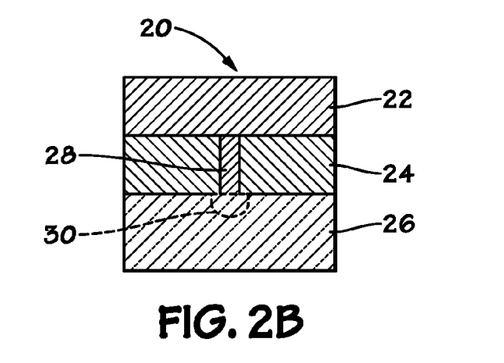

FIGS. 2A and 2B depict cross-sections of a bipolar switching memory cell 20 having built-in "on" state rectifying IV characteristics in accordance with an embodiment of the present invention. FIG. 2A depicts the memory cell 20 in an "off" state and FIG. 2B depicts the memory cell 20 in an "on" state. The bipolar switching memory cell 20 may be formed from a stack having a metal 22, a solid electrolyte 24, and a semiconductor 26.

As shown in FIG. 2A, in the "off" state the memory cell 20 does not have any conducting element in the solid electrolyte 24. To switch the memory cell 20 to the "on" state, a positive voltage may be applied to the metal 22. The minimum required positive voltage to switch the memory cell 20 may be referred to as "Vset." A conducting filament 28 may be formed through a reduction-oxidation (redox) reaction, in the solid electrolyte 24, from metal ions of the metal 22. The filament 28 makes contact with the semiconductor 26, forming a Schottky diode 30 with the semiconductor 26. As explained below, in the "on" state of FIG. 2B, the Schottky diode 30 provides the memory cell 20 with rectifying IV characteristics, enabling the use of such cells 20 in a 4F2 architecture without external selection devices for the cells.

In some embodiments, the filament 28 may be a metal filament or may be a conduction path with low resistance having metallic behavior.

To switch the memory cell 20 to the "off" state shown in FIG. 2A, a negative voltage may be applied on the metal 22. The applied negative voltage is above the redox voltage threshold (referred to as Vreset) of the filament 28. At this threshold voltage, the conducting filament 28 may dissolve through the redox reaction, returning the solid electrolyte 24 to an insulating state.

In some embodiments, the metal 22 may include Ag, Cu, Ni, Zn, or any other suitable metal, or a material that provides an ion source to form the conductive filament 28. The solid electrolyte 24 may include a doped chalcogenide glass of formula AxBy, where B is selected from among S, Se and Te and mixtures thereof, and where A includes at least one element from Group iii-A (B, Al, Ga, In, Tl), group IV-A (C, Si, Ge, Sn, Pb), Group V-A (N, P, As, Sb, Bi), or group VII-A (F, Cl, Br, I, At) of the periodic table and with the dopant being selected from among the noble metals and transition metals including Ag, Au, Pt, Cu, Cd, Ir, Ru, Co, Cr, Mn or Ni. For example, such solid electrolytes may include $As_xSe_{1-x}$—Ag, $Ge_xSe_{1-x}$—Ag, $Ge_xS_{1-x}$—Ag, $As_xS_{1-x}$—Cu, $Ge_xSe_{1-x}$—Cu, $Ge_xS_{1-x}$—Cu, $Ge_xTe_{1-x}$—Cu, $Sn_xSe$, wherein x=0.1 to 0.5, or other doped chalocogenide glasses with Ag, Cu, Zn or with modifiers of halogens, halides or hydrogen (note: x=0.1 to 0.5). In other embodiments, the solid electrolyte 24 may include undoped or doped oxides with such as $MoO_x$, $TaO_x$, $ZrO_x$, $HfO_x$, $TiO_x$, $MgO_x$, $NbO_x$, $AlO_x$, $GdO_x$, $NiO_x$, $GeO_2$, $As_2O_3$, $Ag_2O$, $Cu_{(1,2)}O$, $WO_x$ or other suitable transition metal oxides. In other embodiments, the solid electrolyte 24 may include any suitable rare earth metal oxide, $SiO_x$, high resistivity amorphous or crystalline Si, $Zn_xCd_{(1-x)}S$, amorphous C, CuC, or $Cu_2S$. Additionally, the semiconductor 26 may include GaP, Ge, GaSe, InP, GaAs, InGaP, ZnTe, Si, Ge, ZnS, SiC, GaTe, InGaAs, SrTiO3 (STO), or PrCaMnO (PCMO), In other embodiments, the semiconductor 26 may include a semiconductor silicide such as Ca3Si4, CrSix, RU2Si3, or any suitable silicide.

Additionally, various combinations of the metal 22 and semiconductor 26 may provide for different barrier heights of the Schottky diode 28. Table 1 lists different combinations of the metal 22 and semiconductor 26, and the corresponding barrier height of the Schottky diode 28:

TABLE 1

| Schottky diode barrier heights | |
|---|---|
| Metal/Semiconductor | Barrier Height |
| Cu/GaP | 1.2 eV |
| Cu/n-Ge | 1.22 eV |
| Cu/GaSe | 1.3 eV |
| Cu/p-InP | 1.39 eV |
| Cu/n-GaAs | 0.68 eV |
| Cu/n-GaAs with thin anodic-insulating layer formed by anodic oxidation on the n-GaAS substrate in aqueous $4C_2H_6O_2 + 2H_2O + 0.1H_3PO_4$ electrolyte with ph~2.02 | 0.92 eV |
| Cu/In-GaP | 0.97 eV |
| Cu/p-ZnTe | 0.80 eV |
| Cu/Si | 0.65 eV |
| Cu/C | 1 eV |
| Ag/n-GaAs | 0.88 eV |
| Ag/ZnS | 1.83 eV |
| Ag/p-InP | 1.49 eV |
| Ag/GaP | 1.2 eV |
| Ag/GaSe | 1.2 eV |
| Ag/6H-SiC | 0.97 eV |

TABLE 1-continued

| Schottky diode barrier heights | |
|---|---|
| Metal/Semiconductor | Barrier Height |
| Ag/p-GaTe | 0.63 eV |
| Ag/Si | 0.67 eV |
| Ag/InGaAs | 0.64 eV |
| Zn/p-Si | 0.93 eV |
| Zn/p-GaAs | 1.25 eV |
| Zn/n-Ge | 1.06 eV |
| Zn/p-InP | 1.55 eV |

Figure 3:
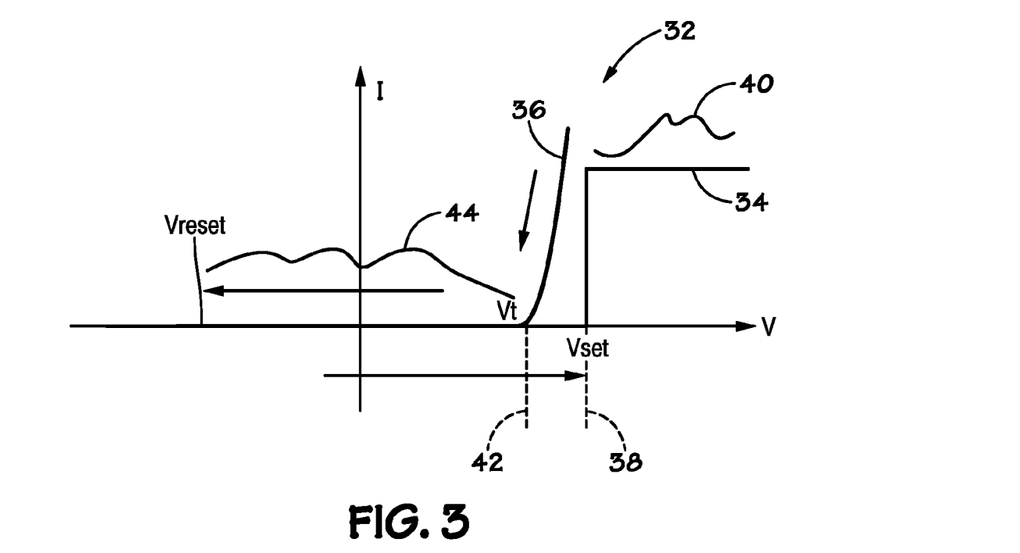
FIG. 3 is a current-voltage (IV) graph of depicting the IV characteristics of the memory cell of FIGS. 2A and 2B in accordance with an embodiment of the present invention.

FIG. 3 depicts an IV graph 32 illustrating the IV characteristics of the memory cell 20 in accordance with an embodiment of the present invention. The IV graph 32 illustrates absolute voltage (V) on the x-axis and current (I) on the y-axis. As shown in FIG. 3, a first IV curve 34 depicts the IV characteristics for switching the memory cell 20 from the "off" state shown in FIG. 2A to the "on" state depicted in FIG. 2B. FIG. 3 also includes a second IV curve 36 depicting the rectifying IV characteristics for the memory cell 20 in the "on" state shown in FIG. 2B As shown in the first IV curve 34, the memory cell 20 has no conductivity and no current until Vset is reached (illustrated at point 38). Once the applied positive voltage reaches Vset, the filament 28 forms and current flows in the memory cell 20 (illustrated by region 40 of the IV curve 34).

As shown in the second IV curve 36, in the "on" state the memory cell 20 has rectifying IV characteristics. Thus, to switch the memory cell 20 from the "on" state to the "off" state, a negative voltage sufficient to overcome the redox threshold voltage (Vreset) is applied to the memory cell 20. As the applied negative voltage increases, the redox reaction dissolves the filament 28 and returns the memory cell 20 to the "off" state (as shown by region 44 of the IV curve 36). As also shown in FIG. 3, Vt (illustrated by point 42) is the threshold voltage for the rectifying behavior to allow current to flow in the memory cell 20.

Figures 4, 5A, 5B:
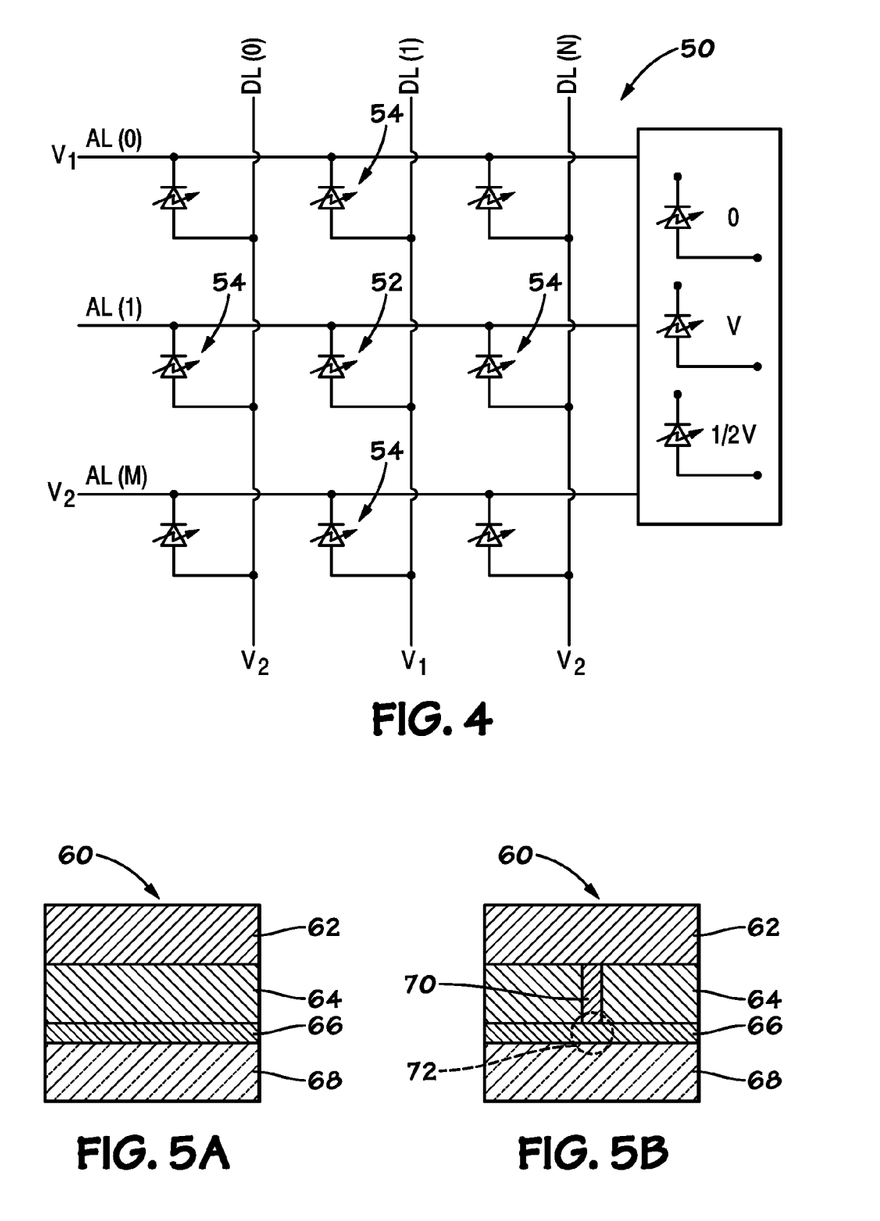
FIG. 4 is a schematic diagram of a memory array depicting operation of the memory cell of FIGS. 2A and 2B in accordance with an embodiment of the present invention.
FIGS. 5A and 5B are cross-sectional views of a resistive random access memory cell in accordance with another embodiment of the present invention.

FIG. 4 is a two-dimensional schematic diagram of a portion of a memory array 50 having bipolar switching memory cells 20 constructed in accordance with embodiments of the present invention. As shown in FIG. 4, the memory cells 20 do not include any external selection device. Operations of the memory array 50 will be described with reference to a selected memory cell 52. As described above, to switch the memory cell 52 to an "on" state, a voltage ($V_1$) larger than Vset may be applied to the selected memory cell 52, such by biasing the digitline DL(1). The adjacent digitlines DL(0) and DL(2) may be biased to a lesser voltage $V_2$. Thus, the voltage $V_2$ may be applied to the memory cells 54 adjacent the selected memory 52. In such an operation, the access line AL(1) may held at 0 volts, and access lines AL(0) and AL(2) may be biased to $V_2$.

The voltage $V_2$ may be smaller than both Vt (the redox threshold voltage) and Vset (the switch "on" voltage) for the memory cells 20. Thus, due to the rectifying IV characteristics of the "on" state of the memory cells 20 and the high resistance of the "off" state of the memory cells 20, the adjacent memory cells 54 experience minimal or no disturb and minimal leakage current during the operation on the selected memory cell 52.

When switching the selected memory cell 52 to the "off" state, a negative voltage above the redox threshold voltage (Vreset) may be applied to the selected memory cell 52. Here again, the adjacent digit lines may be biased to a voltage $V_2$ that is less than the threshold Vt, minimizing or preventing any disturb and minimizing leakage current in the adjacent memory cells 54. Finally, when reading the selected memory cell 52, the voltage $V_1$ may be larger than the rectifying threshold voltage (Vt) and smaller than Vset. Again, the adjacent digit lines DL(0) and DL(2) may be biased to a voltage $V_2$ smaller than Vt, minimizing or preventing any disturb and minimizing leakage current in the adjacent memory cells 54.

In some embodiments, a memory cell may be formed from a metal/solid electrolyte/insulator/electrode stack. FIGS. 5A and 5B depict a bipolar switching memory cell 60 having built-in "on" state rectifying IV characteristics in accordance with another embodiment of the present invention. FIG. 5A depicts the memory cell 60 in an "off" state and FIG. 5B depicts the memory cell 60 in an "on" state. The bipolar switching memory cell 60 may be formed from a stack having a metal 62, a solid electrolyte 64, insulator tunnel barrier 66, and an electrode 68. The insulator tunnel barrier 64 may include one or multiple tunnel barriers.

As shown in FIG. 5A, in the "off" state the memory cell 60 does not have any conducting element in the solid electrolyte 64. To switch the memory cell 60 to the "on" state, a positive voltage may be applied to the metal 62. As noted above, the minimum positive voltage to switch the memory cell 60 "on" may be referred to as "Vset." A conducting metal filament 70 may be formed, through a redox reaction, in the solid electrolyte 64 from metal ions of the metal 62. The metal filament 70 makes contact with the insulator tunnel barrier 66, forming a metal-insulator-metal (MIM) device 72 with the insulator tunnel barrier 66 and the electrode 68. As explained below, the MIM device 72 provides the memory cell 60 with rectifying IV characteristics, similar to the Schottky diode described above in FIGS. 2A and 2B.

As mentioned above, in some embodiments the memory cell 60 may include multiple insulating tunnel barriers 66. In such an embodiment, when switched to the "on" state, the metal filament 70 may form a metal-insulator-insulator-metal (MIIM) device having a first insulator and second insulator between the metal 62 and electrode 68. In other embodiments, the memory cell 60 may include an insulating crested barrier, such that the metal filament 70 may form a metal-crested barrier-metal electrode device.

To switch the memory cell 60 to the "off" state shown in FIG. 5A, a negative voltage may be applied to the metal 62. The negative voltage is applied above the redox voltage threshold (referred to as Vreset) for the metal filament 70. The conducting metal filament 70 may dissolve via the redox reaction, returning the solid electrolyte to an insulator between the metal 62 and the electrode 68.

In some embodiments, the metal 62 may include Ag, Cu, Ni, Zn, or any other suitable metal or a material that provides an ion source to form the conductive filament 28. The solid electrolyte 64 may include a doped chalcogenide glass of formula AxBy, where B is selected from among S, Se and Te and mixtures thereof, and where A includes at least one element from Group iii-A (B, Al, Ga, In, Tl), group IV-A (C, Si, Ge, Sn, Pb), Group V-A (N, P, As, Sb, Bi), or group VII-A (F, Cl, Br, I, At) of the periodic table and with the dopant being selected from among the noble metals and transition metals including Ag, Au, Pt, Cu, Cd, Ir, Ru, Co, Cr, Mn or Ni. For example, such solid electrolytes may include $As_xS_{1-x}$—Ag, $Ge_xSe_{1-x}$—Ag, $Ge_xS_{1-x}$—Ag, $As_xS_{1-x}$—Cu, $Ge_xSe_{1-x}$—Cu, $Ge_xS_{1-x}$—Cu, $Ge_xTe_{1-x}$—Cu, $Sn_xSe$, wherein x=0.1 to 0.5, or other doped chalcogenide glasses with Ag, Cu, Zn or with modifiers of halogens, halides or hydrogen (note: x=0.1 to 0.5). In other embodiments, the solid electrolyte 64. In other embodiments, the solid electrolyte 64 may include undoped or doped oxides with such as $MoO_x$, $TaO_x$, $ZrO_x$, $HfO_x$, $TiO_x$, $MgO_x$, $NbO_x$, $AlO_x$, $GdO_x$, $NiO_x$, $GeO_2$, $As_2O_3$, $Ag_2O$, $Cu_{(1,2)}O$, $WO_x$ or other suitable transition metal oxides. In other embodiments, the solid electrolyte 24 may include any suitable rare earth metal oxide, $SiO_x$, high resistivity amorphous or crystalline Si, $Zn_xCd_{(1-x)}S$, amorphous C, CuC, or $Cu_2S$. Additionally, in some embodiments the semiconductor 26 may include GaP, Ge, GaSe, InP, GaAs, InGaP, ZnTe, Si, Ge, ZnS, SiC, GaTe, InGaAs, SrTiO3 (STO), or PrCaMnO (PCMO). The tunnel barrier 66 may include $SiO_2$, $Si_3N_4$, $HfO_2$, $ZrO_2$, or $SrTiO_x$ and may have a thickness of about 1 nm, 2 nm, 3 nm, 4 nm, 5 nm, 6 nm, 7 nm, 8 nm, 9 nm, or up to 10 nm.

In some embodiments, the electrode may be an oxidizable electrode and may include Ag, AgI, AgS, $Ag_xSe$, $Ag_xTe$, $Ag_yI$, $CuI_2$, CuO, CuS, CuSe, CuTe, CuAsTe and CuAsSe, $Cu_2SSe$, $Cu_2SeS$, $Cu_2TeS$, and $Cu_2TeSe$, or $Cu_2CdSnSe_4$. The electrode may be of the formula $A_x(MB_2)_{1-x}$, where A is Cu or Ag or Zn; B is S or Se; and M is a transition metal such as Ta, V or Ti. Additionally, in some embodiments, the electrode may be ZnS, ZnSe, ZeTe or suitable Zn compounds.

In other embodiments, the electrode 68 may be an inert electrode such as a refractory metal nitride, carbide, and boride, Such electrodes may include TiN, ZrN, HfN, VN, NbN, TaN, TiC, ZrC, HfC, VC, NbC, TaC, $TiB_2$, $ZrB_2$, $HfB_2$, $VB_2$, $NbB_2$, $TaB_2$, $Cr_3C_2$, $Mo_2C$, WC, $CrB_2$, $Mo_2B_5$, or $W_2B_5$. Additionally, in other embodiments the electrode 68 may include TiAlN, TiSiN, TiW, TaSiN, TiCN, SiC, $B_4C$, $WSi_x$, $MoSi_2$, metal alloys such as NiCr or other suitable alloys, W, Nb, Ru, Ni, Mo, Pt, TiW, metal silicides, or any other suitable material.

Figure 6:
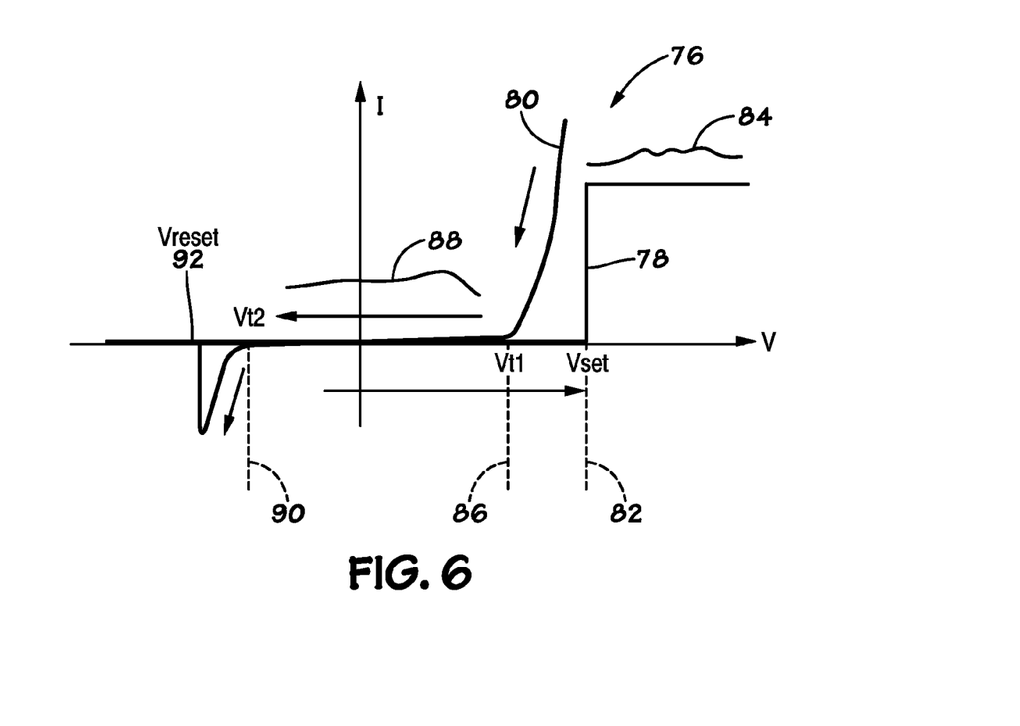
FIG. 6 is a IV graph of depicting the IV characteristics of the memory cell of FIGS. 3A and 3B in accordance with an embodiment of the present invention.

FIG. 6 depicts an IV graph 76 illustrating the IV characteristics of the memory cell 60 in accordance with an embodiment of the present invention. The IV graph 76 illustrates voltage (V) on the x-axis and current (I) on the y-axis. As shown in FIG. 6, a first IV curve 78 depicts the IV characteristics for switching the memory cell 60 from the "off" state shown in FIG. 5A to the "on" state depicted in FIG. 5B. FIG. 6 also includes a second IV curve 80 depicting the rectifying IV characteristics for the memory cell 60 in the "on" state shown in FIG. 2B. The second IV curve 80 depicts a first threshold voltage ($Vt_1$) for the metal-insulator-metal (MIM) device 72 and a second threshold voltage ($Vt_2$) for the metal-insulating tunnel barrier-electrode structure of the memory cell 60.

As shown in the first IV curve 78, the memory cell 60 has no conductivity and no current until Vset is applied (illustrated at point 82). Once the applied positive voltage reaches Vset, the metal filament 70 forms and current flows in the memory cell 60 (illustrated by region 84 of the IV curve 78).

As shown in the second IV curve 80, in the "on" state the memory cell 60 exhibits rectifying IV characteristics of the MIM device 72. To switch the memory cell 60 from the "on" state to the "off" state, a negative voltage sufficient to overcome the redox threshold voltage (Vreset) is applied to the memory cell 60 (illustrated by point 92). As the applied negative voltage increases, the redox reaction dissolves the metal filament 70 and returns the memory cell 60 to the "off" state (as shown by region 88 of the IV curve 36). Additionally, the memory cell 60 may have a second threshold voltage ($Vt_2$) that corresponds to the current conduction for the metal/insulating tunnel barrier/metal electrode structure (illustrated by point 90). During switching of the memory cell 60 to the "off" state, the applied negative voltage may be greater than the second threshold voltage ($Vt_2$) in magnitude.

Figure 7:
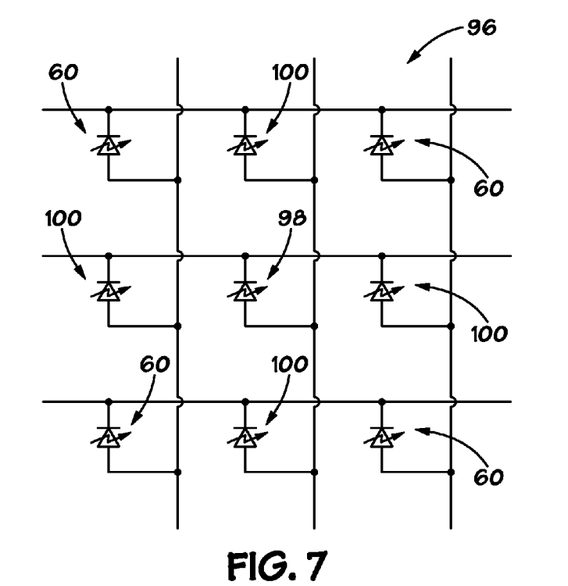
FIG. 7 is a schematic diagram of a memory array depicting operation of the memory cell of FIGS. 5A and 5B in accordance with an embodiment of the present invention.

FIG. 7 is a two-dimensional schematic diagram of a portion of a memory array 96 having memory cells 60 constructed in accordance with embodiments of the present invention. The operation of the memory array 96 may be similar to the operation of the memory array 50 described above in FIG. 4. For example, the MIM device 72 may provide similar rectifying IV characteristics as the Schottky diode 30 of the memory cell 20 depicted in FIGS. 2A and 2B. As described above, to switch a selected memory cell 98 to an "on" state, a voltage ($V_1$) may be larger than Vset may be applied to the selected memory cell 98, such as by biasing the digit line DL(1). The adjacent digit lines DL(0) and DL(2) may be biased to a lesser voltage $V_2$, and such voltage is applied to the adjacent memory cells 100. The voltage $V_2$ is smaller than both $Vt_1$ (the threshold voltage for the MIM device 72) and Vset (the switch "on" voltage) for the memory cells 60. Thus, the adjacent memory cells 100 may experience minimal or no disturb and may produce minimal leakage current.

When switching the selected memory cell 98 to the "off" state, a negative voltage above the redox threshold voltage (Vreset) may be applied to the selected memory cell 98. Again, in such an operation the adjacent digitlines may be biased to a voltage $V_2$ that is less than the threshold voltage $Vt_1$ and the threshold voltage $Vt_2$, minimizing or preventing any disturb and minimizing leakage current of the adjacent memory cells 100. Similarly, a read operation of the selected memory cell 98 may result in minimal or no disturb and minimal leakage current in the manner described above.

Figure 8:
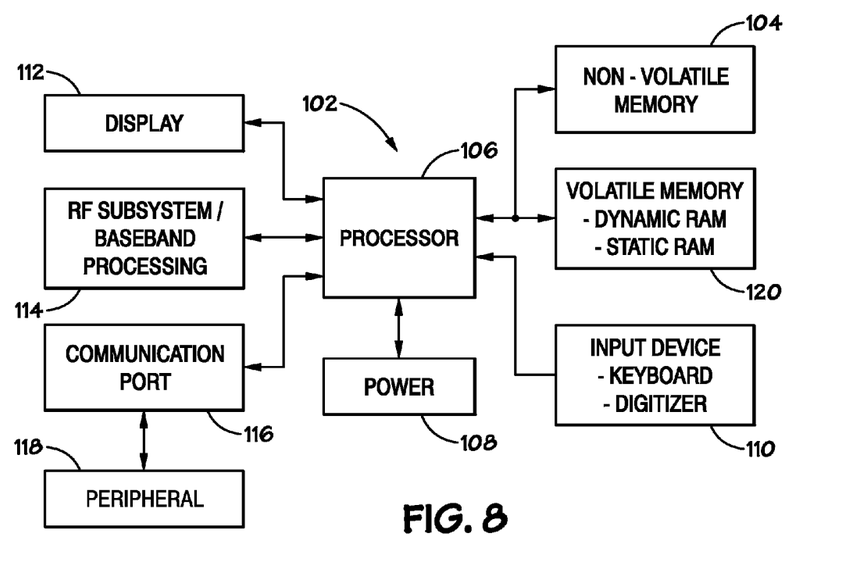
FIG. 8 is block diagram of a process-based system in accordance with an embodiment of the present invention.

FIG. 8 is a block diagram that depicts a processor-based system, generally designated by reference numeral 102, having a non-volatile memory 104 constructed in accordance one or more of the embodiments discussed above. For example, the system 102 may be any of a variety of types such as a computer, pager, cellular phone, personal organizer, control circuit, etc. In a typical processor-based system, one or more processors 106, such as a microprocessor, control the processing of system functions and requests in the system 102.

The system 102 typically includes a number of components. For example, the system 102 includes a power supply 108. For instance, if the system 102 is a portable system, the power supply 108 may advantageously include permanent batteries, replaceable batteries, and/or rechargeable batteries. The power supply 108 may also include an AC adapter, so the system 102 may be plugged into a wall outlet, for instance. The power supply 108 may also include a DC adapter such that the system 102 may be plugged into a vehicle cigarette lighter, for instance.

Various other devices may be coupled to the processor 106 depending on the functions that the system 102 performs. For instance, an input device 110 may be coupled to the processor 106. The user interface 110 may include buttons, switches, a keyboard, a light pen, a mouse, and/or a voice recognition system, for instance. A display 112 may also be coupled to the processor 106. The display 112 may include an LCD display, a CRT, LEDs, and/or an audio display, for example. Furthermore, an RF sub-system/baseband processor 114 may also be coupled to the processor 106. The RF sub-system/baseband processor 114 may include an antenna that is coupled to an RF receiver and to an RF transmitter (not shown). One or more communication ports 116 may also be coupled to the processor 106. The communication port 116 may be adapted to be coupled to one or more peripheral devices 118 such as a modem, a printer, a computer, or to a network, such as a local area network, remote area network, intranet, or the Internet, for instance.

The processor 106 generally controls the system 102 by implementing software programs stored in the memory. The memory is operably coupled to the processor 106 to store and facilitate execution of various programs. For instance, the processor 106 may be coupled to a volatile memory 120 which may include Dynamic Random Access Memory (DRAM) and/or Static Random Access Memory (SRAM).

As mentioned above, the processor 106 may also be coupled to the non-volatile memory 104. The non-volatile memory 104 may include RRAM constructed in accordance with the embodiments depicted above in FIGS. 2A and 2B and/or FIGS. 5A and 5B. Additionally, the non-volatile memory 104 may include a read-only memory (ROM), such as an EPROM, and/or res memory to be used in conjunction with the volatile memory. Additionally, the non-volatile memory 104 may include magnetic storage such as a tape drives, hard disks and the like.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method, comprising:
switching a resistive random access memory cell to a first state;
forming a metal filament in a solid electrolyte of the memory cell, wherein the metal filament forms between a metal disposed on the solid electrolyte and a tunnel barrier disposed on a metal electrode of the memory cell, and wherein the metal filament is configured to substantially contact the metal and the tunnel barrier; and
forming a metal-insulator-metal device via the metal filament.

2. A method, comprising:
switching a resistive random access memory (RRAM) cell to a first state, comprising:
forming a metal filament in a solid electrolyte of the memory cell, wherein the metal filament forms between a metal disposed on the solid electrolyte and a semiconductor, and wherein the metal filament is configured to substantially contact the solid electrolyte and the semiconductor; and
forming a Schottky diode with the semiconductor via the metal filament.

3. The method of claim 2, comprising dissolving the metal filament.

4. The method of claim 3, wherein forming a first metal filament comprising biasing a digitline coupled to the RRAM cell to a first voltage.

5. The method of claim 4, wherein dissolving the metal filament comprises biasing the digitline to a second voltage.

6. A memory device, comprising,
a bipolar switching resistive random access memory (RRAM) array comprising a plurality of memory cells, wherein each of the plurality of memory cells is configured to form a respective built-in selection device having rectifying current-voltage (IV) characteristics, and wherein the respective built-in selection device is configured to substantially contact a metal and semiconductor of a respective one of the plurality of memory cells.

7. The memory device of claim 6, wherein the built-in selection device comprises a Schottky diode.

8. The memory device of claim 6, wherein the built-in selection device comprises a metal-insulator-metal device or a metal-insulator-insulator-metal device.

9. The memory device of claim 6, wherein each of the plurality of memory cells is not coupled to an external diode selection device.

10. A memory device, comprising:
a resistive random access memory (RRAM) cell, comprising:
an electrode;
a first tunnel barrier, a second tunnel barrier, a third tunnel barrier, or any combination thereof, disposed on the electrode;
an electrolyte disposed on the first tunnel barrier; and
a metal disposed on the electrolyte, wherein the metal comprises a metal ion source.

11. A resistive random access memory (RRAM) cell, comprising:
a semiconductor;
an electrolyte disposed on the semiconductor;
a metal disposed on the electrolyte, wherein the metal comprises a metal ion source; and
a metal filament formed in the electrolyte in a first state of the RRAM cell, wherein the metal filament is configured to substantially contact the semiconductor and the metal.

12. The RRAM cell of claim 11, wherein the metal comprises Ag, Cu, Ni, or Zn.

13. The RRAM cell of claim 11, wherein the solid electrolyte comprises doped chalcogenide glass of formula AxBy, where B is selected from among S, Se and Te and mixtures thereof, and where A includes at least one element from the group of B, Al, Ga, In, or Tl, from the group of C, Si, Ge, Sn, Pb, from the group of N, P, As, Sb, Bi, or from the group of F, Cl, Br, I, or At of the periodic table and with the dopant being selected from among the group of Ag, Au, Pt, Cu, Cd, Ir, Ru, Co, Cr, Mn or Ni.

14. The RRAM cell of claim 11, wherein the semiconductor comprises GaP, Ge, GaSe, InP, GaAs, InGaP, ZnTe, Si, Ge, ZnS, SiC, GaTe, InGaAs, SrTiO3 (STO), or PrCaMnO (PCMO).

15. The RRAM cell of claim 11, comprising a Schottky diode formed by the metal filament and the semiconductor.

16. The RRAM cell of claim 11, wherein the RRAM cell has rectifying current-voltage (IV) characteristics in the first state.

17. A memory device, comprising:
a resistive random access memory (RRAM) cell, comprising:
an electrode;
a first tunnel barrier disposed on the electrode;
an electrolyte disposed on the first tunnel barrier;
a metal disposed on the electrolyte, wherein the metal comprises a metal ion source; and
a metal filament formed in the electrolyte, wherein the metal filament is configured to substantially contact the electrode and the first tunnel barrier.

18. The memory device of claim 17, wherein the metal comprises Ag, Cu, Ni, or Zn.

19. The memory device of claim 17, wherein the solid electrolyte comprises doped chalcogenide glass of formula AxBy, where B is selected from among S, Se and Te and mixtures thereof, and where A includes at least one element from the group of B, Al, Ga, In, or Tl, from the group of C, Si, Ge, Sn, Pb, from the group of N, P, As, Sb, Bi, or from the group of F, Cl, Br, I, or At of the periodic table and with the dopant being selected from among the group of Ag, Au, Pt, Cu, Cd, Ir, Ru, Co, Cr, Mn or Ni.

20. The memory device of claim 17, wherein the electrode comprises an oxidizable electrode.

21. The memory device of claim 20, wherein the electrode comprises one of Ag, AgI, AgS, AgxSe, AgxTe, AgyI, CuI2, CuO, CuS, CuSe, CuTe, CuAsTe and CuAsSe, Cu2SSe, Cu2SeS, Cu2TeS, and Cu2TeSe, or Cu2CdSnSe4.

22. The memory device of claim 17, wherein the electrode comprises an inert electrode.

23. The memory device of claim 22, wherein the electrode comprises one of TiN, ZrN, HfN, VN, NbN, TaN, TiC, ZrC, HfC, VC, NbC, TaC, TiB2, ZrB2, HfB2, VB2, NbB2, TaB2, Cr3C2, Mo2C, WC, CrB2, Mo2B5, or W2B5.

24. The memory device of claim 17, comprising a metal-insulator-metal device formed by the electrode, the electrolyte, and the metal.

25. A non-volatile memory cell comprising:
an electrode;
an insulator tunnel barrier formed on the electrode;
an insulating solid electrolyte formed on the insulator tunnel barrier; and
a metal ion source formed on the insulating solid electrolyte,
wherein the memory cell in operation is operable to be placed in a first state by applying a positive voltage between the metal ion source and the electrode to form a conducting filament in the insulating solid electrolyte, the conducting filament substantially contacting the metal ion source and the insulator tunnel barrier thereby coupling metal ion source to the insulator tunnel barrier, wherein the memory cell in operation is further operable to be placed in a second state by applying a negative voltage between the metal ion source and the electrode to dissolve the conducting filament.

* * * * *

UNITED STATES PATENT AND TRADEMARK OFFICE
CERTIFICATE OF CORRECTION

PATENT NO. : 8,487,293 B2  Page 1 of 1
APPLICATION NO. : 12/981947
DATED : July 16, 2013
INVENTOR(S) : Jun Liu et al.

It is certified that error appears in the above-identified patent and that said Letters Patent is hereby corrected as shown below:

In the Claims:

In column 10, line 19, in Claim 21, delete "Agyl," and insert -- AgyI, --, therefor.

Signed and Sealed this
Twelfth Day of November, 2013

Teresa Stanek Rea
*Deputy Director of the United States Patent and Trademark Office*